(12) United States Patent
Tsyrganovich

(10) Patent No.: US 7,414,554 B1
(45) Date of Patent: Aug. 19, 2008

(54) LOW-COST LINEARITY CORRECTION IN AN ADC WITHOUT STORING LOOKUP TABLES

(75) Inventor: Anatoliy V. Tsyrganovich, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 0 days.

(21) Appl. No.: 11/512,295

(22) Filed: Aug. 29, 2006

(51) Int. Cl.
*H03M 1/10* (2006.01)
(52) U.S. Cl. ...................................... 341/120; 341/155
(58) Field of Classification Search ......... 341/115–155, 341/120
See application file for complete search history.

(56) References Cited

U.S. PATENT DOCUMENTS 6,211,803 B1 * 4/2001 Sunter ..................... 341/120

\* cited by examiner

*Primary Examiner*—Lam T Mai
(74) *Attorney, Agent, or Firm*—Imperium Patent Works; T. Lester Wallace; Darien K. Wallace

(57) ABSTRACT

Linearity correction is performed by determining whether a data output value (DOUT) from an analog-to-digital converter (ADC) is in a first subrange or a second subrange. If DOUT is in the first subrange, then DOUT is scaled by a first scaling correction factor (SCF1), and the result is adjusted by a first best fit adjustment value (BFAV1). If DOUT is in the second subrange, then DOUT is scaled by a second scaling correction factor (SCF2), and the result is adjusted by a second best fit adjustment value (BFAV2). The data output range of an ADC can be processed in many ranges of such subranges. Techniques are set forth for determining SCF1, SCF2, BFAV1 and BFAV2. Employing the linearity correction method allows a low-cost microcontroller having an ADC to perform adequate linearity correction on the ADC output data without having to store an INL lookup table.

20 Claims, 11 Drawing Sheets

DC OFFSET CORRECTION

GAIN ERROR CORRECTION

BEST FIT $$DOUT_C = \left[(DOUT - DOUT_{LO})\underbrace{\left(1 - \frac{DOUTA - DOUTD}{DOUTA}\right)}_{\text{SCALING CORRECTIONAL FACTOR (SCF1)}} - \underbrace{\frac{MAXINL21}{2}}_{\text{BEST FIT ADJUSTMENT VALUE (BFAV1)}}\right] + DOUT_{LO}$$

INL-CORRECTED DATA OUTPUT VALUE $$DOUT_C = \left[ (DOUT_{RO} - DOUT)\left(1 - \frac{DOUTA - DOUTD}{DOUT_{RO} - DOUTA}\right) \right] - \frac{MAXINL22}{2}$$

↑ INL-CORRECTED DATA OUTPUT VALUE

SCALING CORRECTIONAL FACTOR (SCF2)

BEST FIT ADJUSTMENT VALUE (BFAV2)

INL CORRECTION AND BEST FIT DONE
BY SOFTWARE IN MICROCONTROLLER

DETERMINING INL CORRECTION VALUES AND LOADING
CORRECTION DATA INTO ADC DURING MANUFACTURING

LOW-COST LINEARITY CORRECTION IN AN ADC WITHOUT STORING LOOKUP TABLES

TECHNICAL FIELD

The present invention relates to linearity correction in analog-to-digital converter (ADC) systems.

BACKGROUND

When the data output values of an analog-to-digital converter (ADC) are graphed with respect to the voltage input values that gave rise to those data output values, a transfer function of the ADC is obtained. The transfer function often differs from an ideal linear transfer function in that the transfer function may have a DC offset, may have gain error, and may exhibit non-linearity. There are many known and conventional numerical analysis techniques such as linear approximation for changing the data output values of an ADC to make the effective transfer function of the ADC system closer to the ideal transfer function. Another technique involves a lookup table. For each data output value that is output from the ADC, a substitute data output value is stored where the substitute data output value satisfies the ideal transfer function. When the analog-to-digital converter outputs a data output value, the lookup table is consulted and the substitute data output value is substituted for the data output value output by the ADC. DC offset, gain error and non-linearity are corrected in one lookup operation. This solution is flexible, works well and is suitable for many applications. Some ADC applications, however, are extremely cost sensitive. In such low-cost ADC applications, providing a large enough memory to store the lookup table may be undesirably expensive or even prohibitively expensive. In such low-cost ADC applications, providing program memory space to store an involved linear approximation program is undesirable.

SUMMARY

An INL correction and best fit program performs linearity correction by determining whether and data output value (DOUT) from an analog-to-digital converter (ADC) is in a first subrange or a second subrange. If DOUT is in the first subrange, then DOUT is scaled by a first scaling correctional factor (SCF1), and the result is adjusted by a first best fit adjustment value (BFAV1). If DOUT is in the second subrange, then DOUT is scaled by a second scaling correctional factor (SCF2), and the result is adjusted by a second best fit adjustment value (BFAV2). The data output range of an ADC can be processed using many ranges of such subranges. Techniques are set forth for determining SCF1, SCF2, BFAV1 and BFAV2. Employing the novel linearity correction method disclosed here allows a low-cost microcontroller having an ADC to perform adequate linearity correction on the ADC output data without having to store lengthy linear approximation code or to store an INL lookup table.

In one advantageous aspect, subtraction and scaling routines are stored in program memory along with the INL correction and best fit program. The subtraction routine is employed in a conventional manner to perform DC offset correction. Similarly, the scaling routine is employed in a conventional manner to perform gain error correction. These same subtraction and scaling routines are then called by the INL correction and best fit program in the carrying out of the INL correction and best fit operations set forth above. Utilizing such preexisting subtraction and scaling routines in INL correction reduces the cost associated with supporting INL correction by reducing the additional amount of program memory required to provide the INL correction functionality.

Other embodiments and advantages and considerations are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
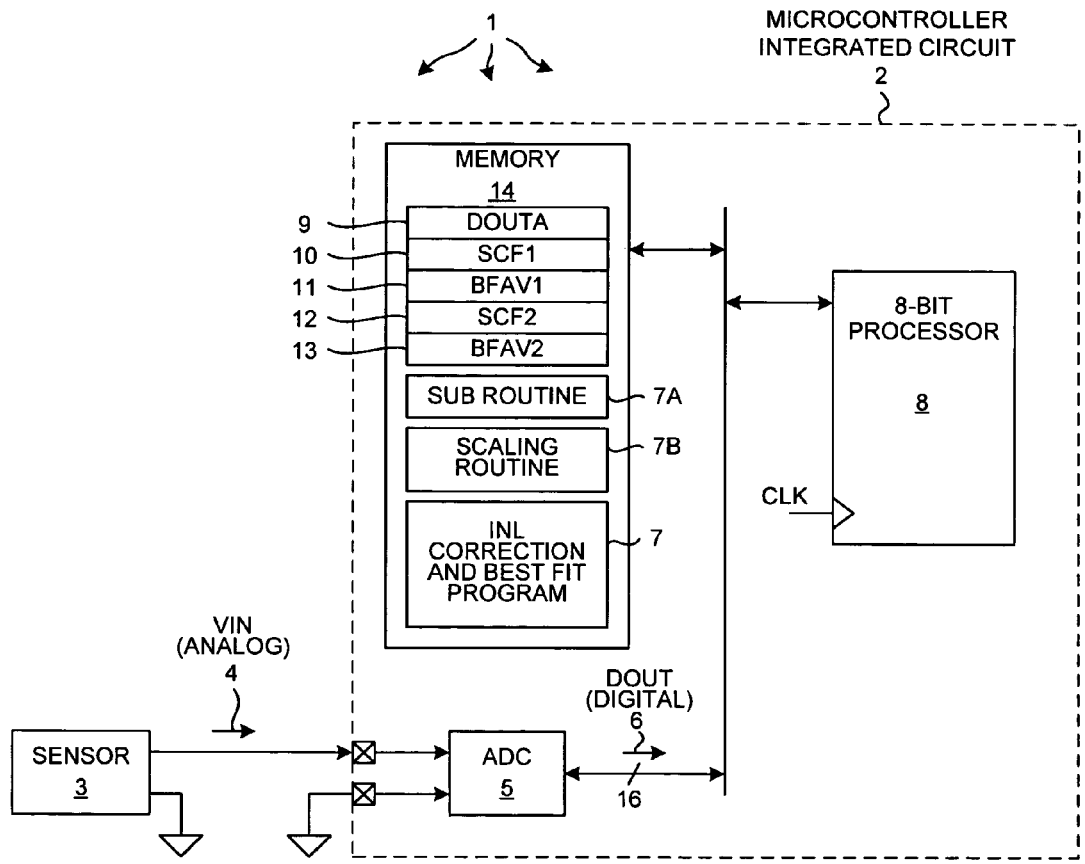
FIG. 1 is a block diagram of an analog-to-digital converter (ADC) system.

FIG. 1 is a block diagram of an analog-to-digital converter (ADC) system 1. A microcontroller integrated circuit 2 receives an analog voltage input signal (VIN) from an external sensor 3. The analog input voltage 4 is digitized by an analog-to-digital converter (ADC) 5 into a corresponding sixteen-bit digital data output (DOUT) value 6. If different VIN voltages over an input voltage range are converted by ADC 5 into a corresponding set of DOUT values, and if the DOUT values are graphed, a transfer function is revealed. This transfer function in the example of FIG. 2 exhibits what is called "DC offset", "gain error", and "non-linearity".

A subtraction routine 7A and a scaling routine 7B are used to process the DOUT values to remove DC offset and gain error. The DC offset corrected and gain error corrected DOUT values are then processed by INL correction and best fit software 7 executing on 8-bit processor 8. The software 7, the routines 7A and 7B, as well as several values 9-13 used by the software are stored in memory 14. Values 9, 11 and 13 are two-byte values. Values 10 and 12 are one-byte values. ADC 5 may be any type of analog-to-digital converter such as, for example, a sigma delta ADC or a SAR (successive approximation) ADC. The microcontroller 2 may, for example, employ the Z8 instruction set and may have the structure of the well-known Z8 microcontroller available from Zilog Inc., of San Jose, Calif. Memory 14 can involve any suitable type of memory such as, for example, read-only memory (ROM), one-time programmable (OTP) memory, random-access memory (RAM), non-volatile memory such as FLASH memory, EPROM, EEPROM, or a mixture of these types of memory.

Figure 2:
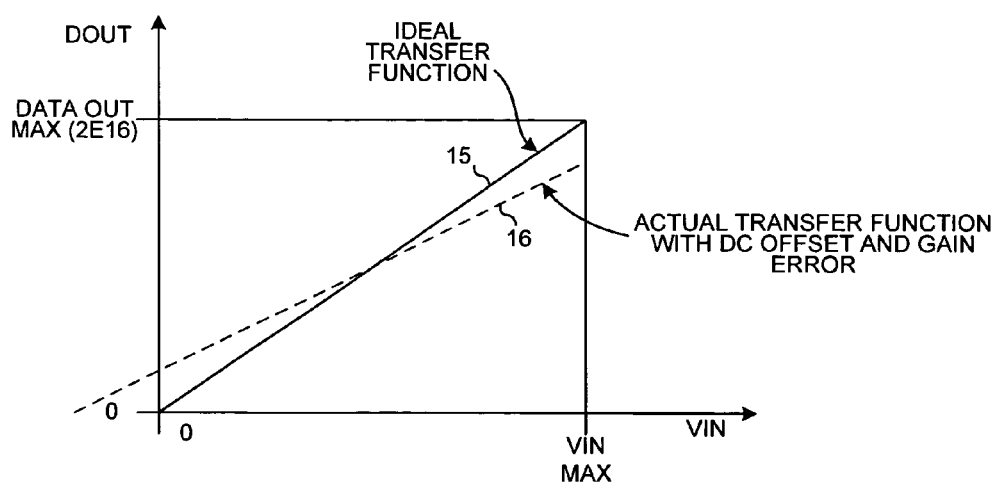
FIG. 2 illustrates an actual ADC transfer function exhibiting DC offset and gain error.

FIG. 2 is a graph of DOUT versus VIN. Solid line 15 represents an ideal transfer function. Dashed line 16 represents the actual transfer function 16. The actual transfer function exhibits a DC offset as well as gain error.

Figure 3:
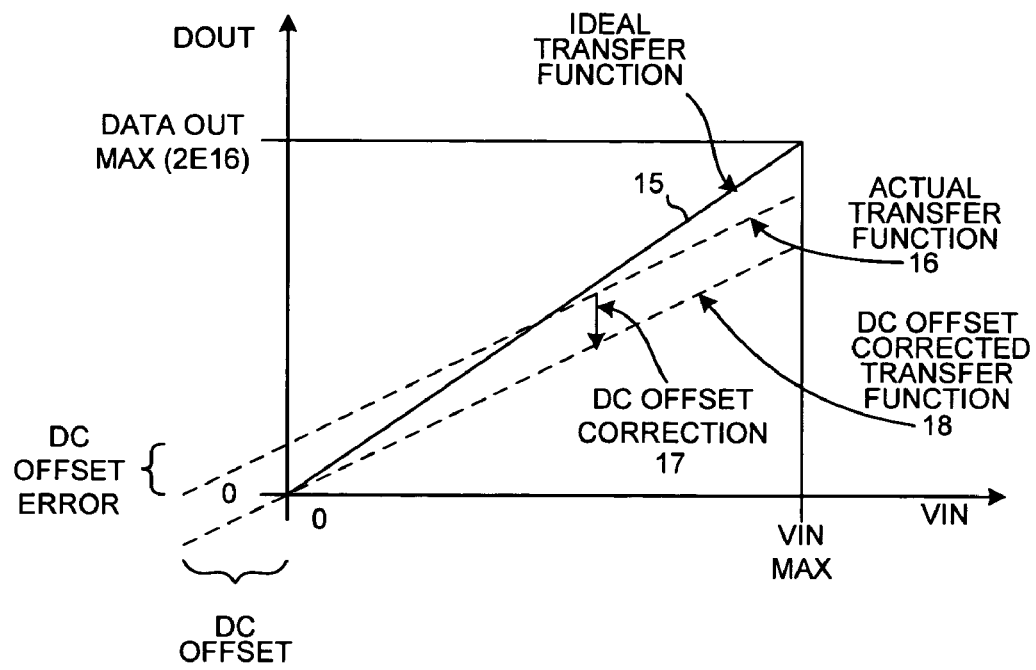
FIGS. 3 and 4 illustrate a method of removing the effects of DC offset and gain error.

FIG. 3 is a graph of DOUT versus VIN. The graph illustrates how the DC offset can be corrected. Subtraction routine 7A is used to subtract a DC offset correction amount 17 from each DOUT value so as to shift the actual transfer function line 16 to shifted transfer function line 18. In the present example where DOUT is a 16-bit value, and processor 8 is an 8-bit processor, execution of the subtraction routine 7A involves execution of a substantial number of instructions.

Figure 4:
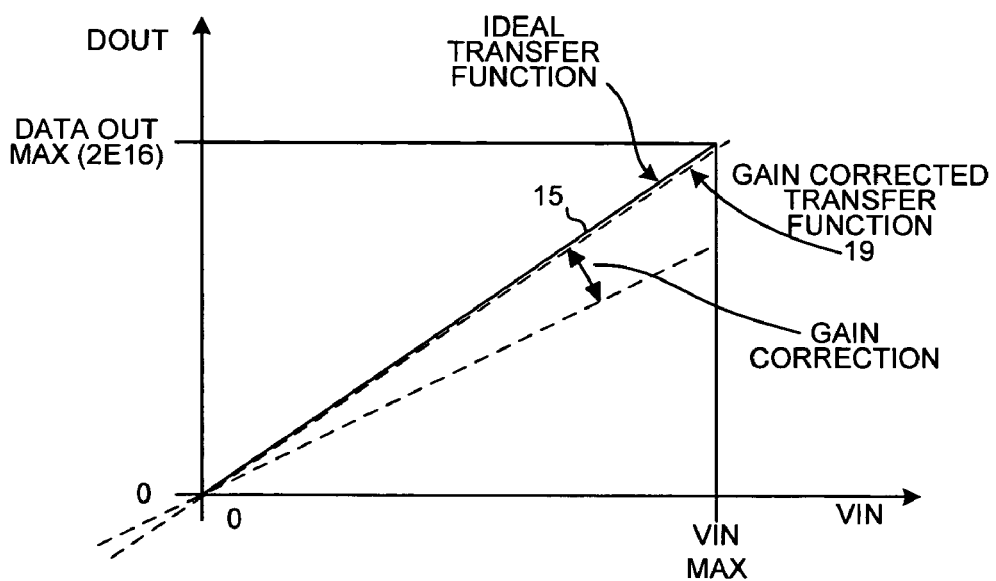

FIG. 4 is a graph of DOUT versus VIN. The graph illustrates how gain error in the DC offset corrected transfer function line 18 can be removed. Scaling routine 7B is used to multiply every DOUT value on line 18 by a scaling factor to change the slope of the transfer line to that of gain corrected transfer function line 19. Note that after the DC offset correction of FIG. 3 and the gain error correction of FIG. 4, the resulting transfer function 19 is the ideal transfer function 15. The transfer function characteristic of ADC 5 does not, however, only exhibit an DC offset and gain error. The transfer function also exhibits non-linearity.

Figure 5:
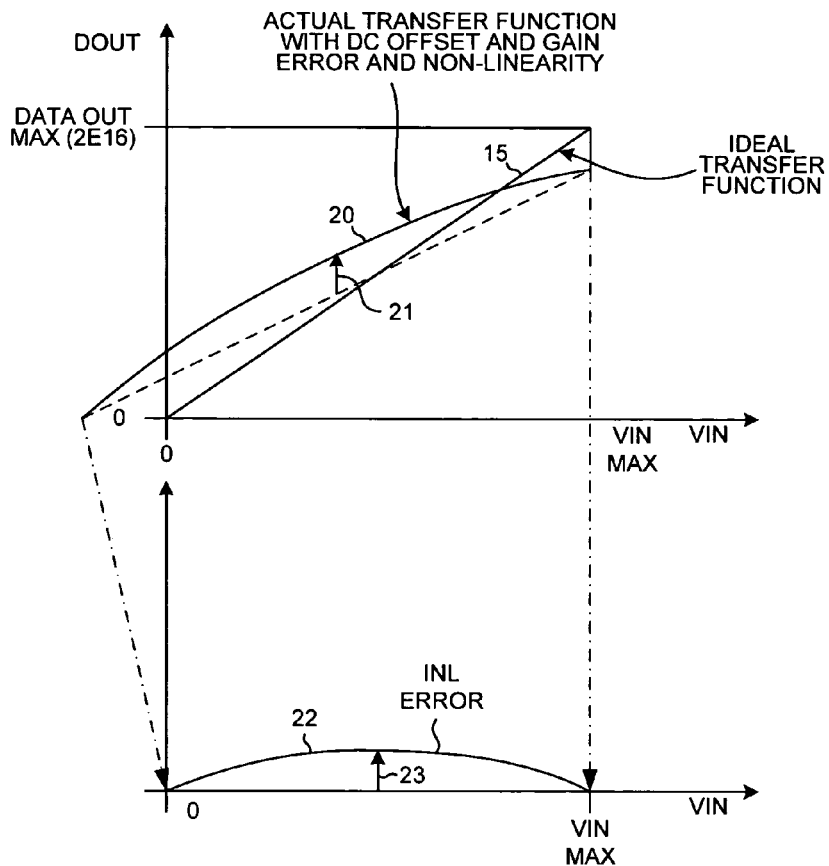
FIG. 5 illustrates an actual ADC transfer function exhibiting non-linearity.

FIG. 5 is a graph of DOUT versus VIN. The actual transfer function of ADC 5 is represented by curved line 20. The curvature in this line represents non-linearity. Arrow 21 indicates the point of maximum error. The lower portion of FIG. 5 is a graph of the integral non-linear error (INL error) of the actual transfer function. Curved line 22 graphs the INL error after the DC offset and gain error in curve 20 have been removed. Arrow 23 corresponds to arrow 21. Arrow 21 indicates the maximum INL error value (MAX INL).

Figure 6:
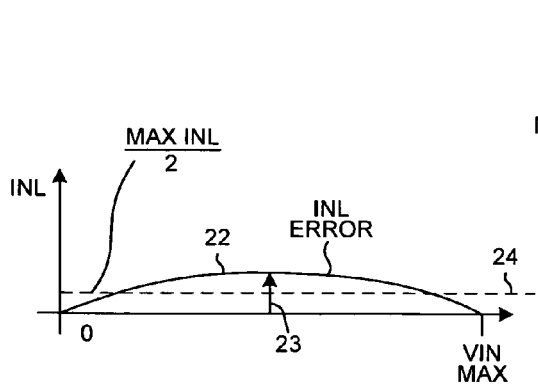
FIG. 6 illustrates the determination of a best fit adjustment value.
Figure 7:
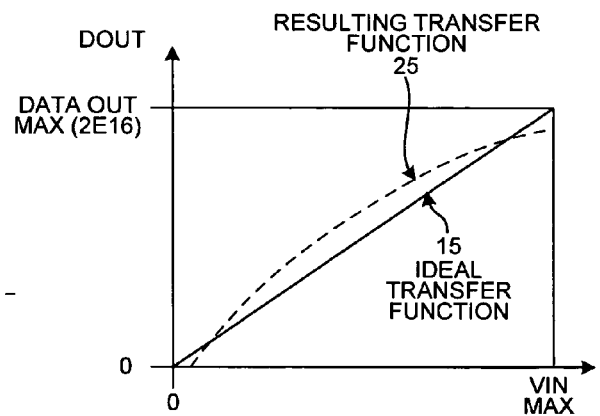
FIG. 7 illustrates using a best fit adjustment value to perform a best fit operation.

FIG. 6 illustrates a step in a novel best fit method. MAX INL is divided by two. This level of INL is indicated by dashed line 24. After a DOUT value has been DC offset corrected and gain error corrected, the value MAX INL divided by two is then subtracted from it. FIG. 7 illustrates the resulting best fit transfer function 25. Transfer function 25 has a "best fit" with respect to the ideal transfer function line 15.

Figure 8:
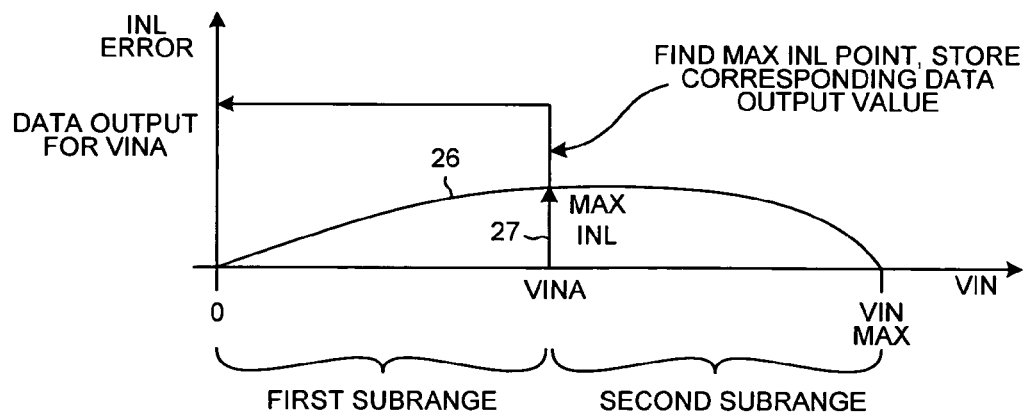
FIG. 8 illustrates the determination of a DOUT value that separates a range of DOUT values into two subranges in accordance with one novel method.
Figure 9:
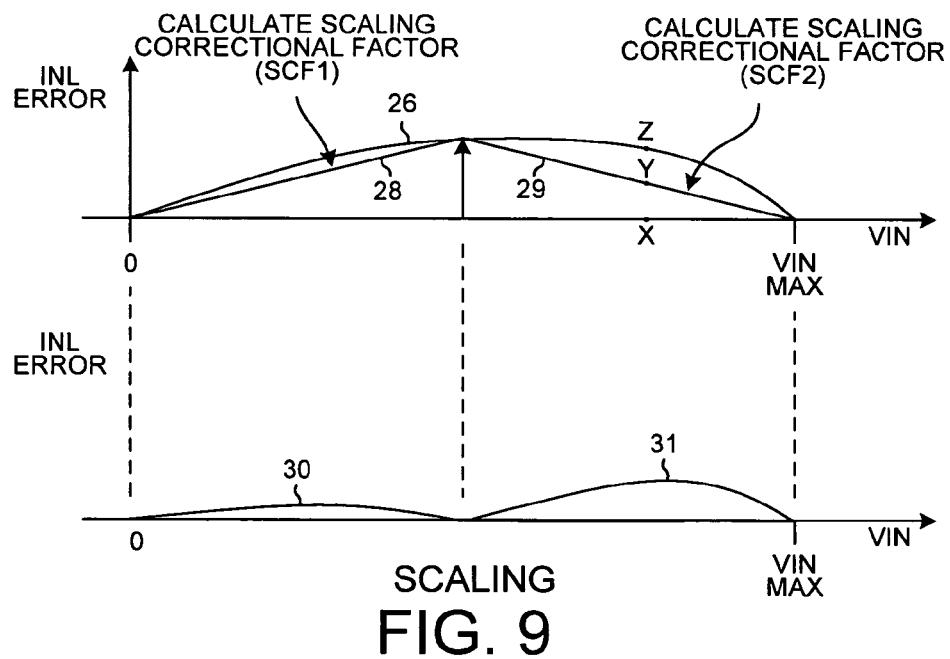
FIG. 9 illustrates the effect of using scaling correction factors SCF1 and SCF2 on the two subranges of FIG. 8.
Figure 10:
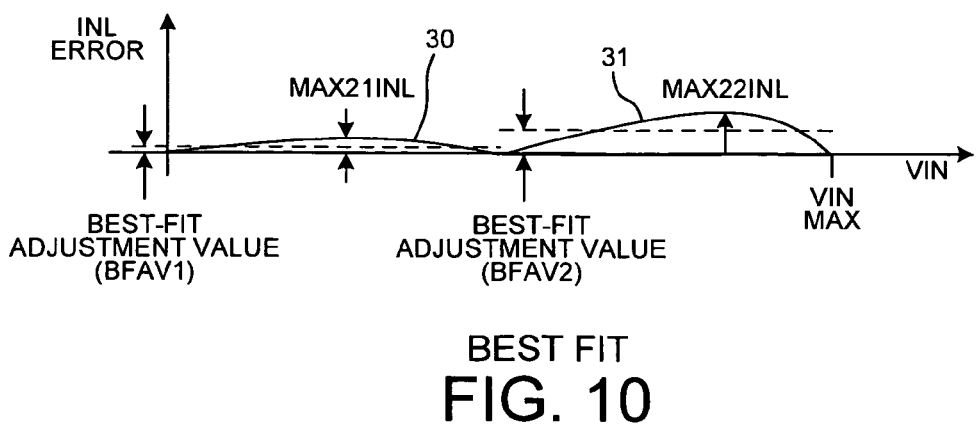
FIG. 10 illustrates the determination of best fit adjustment values BFAV1 and BFAV2 for the two subranges.

FIGS. 8-10 illustrate an INL error curve 26 over a range of VIN voltages from zero to VIN maximum (VIN MAX). Arrow 27 indicates the point of the maximum INL error within the VIN range of FIG. 8. Note that the INL curve 26 is not symmetrical about arrow 27. INL MAX separates the VIN range into a first subrange (from zero to VINA) and a second subrange (from VINA to VIN MAX). VINA is the input voltage on INL curve 26 that has the maximum INL error. The VIN range corresponds to a range of data output values (DOUT), and each of the two VIN subranges corresponds to a DOUT subrange.

FIG. 9 shows how each INL error value on curve 26 can be considered to be the sum of two values. One value is along one of the lines 28 or 29. The other value is the vertical distance between the value on one of the lines and a point on curve 26. For example, the INL error value of point Z is the sum of INL error amount X-Y and INL error amount Z-Y. The lower portion of the graph of FIG. 9 illustrates the INL error of the upper graph of FIG. 9 with the INL error component underneath lines 28 and 29 removed. The result is two INL error curves 30 and 31.

FIG. 10 illustrates how, for each INL curve, the maximum INL error value is determined. The maximum INL error value for curve 30 is MAX21INL. The maximum INL error value for curve 31 is MAX22INL. As in the case of FIG. 6 where half of the maximum INL error value was used to best fit the INL curve to the ideal transfer function line, in FIG. 10 half of the maximum INL error values can be used to best fit the two INL curves 30 and 31 to the ideal transfer function curve.

Figures 11, 12:
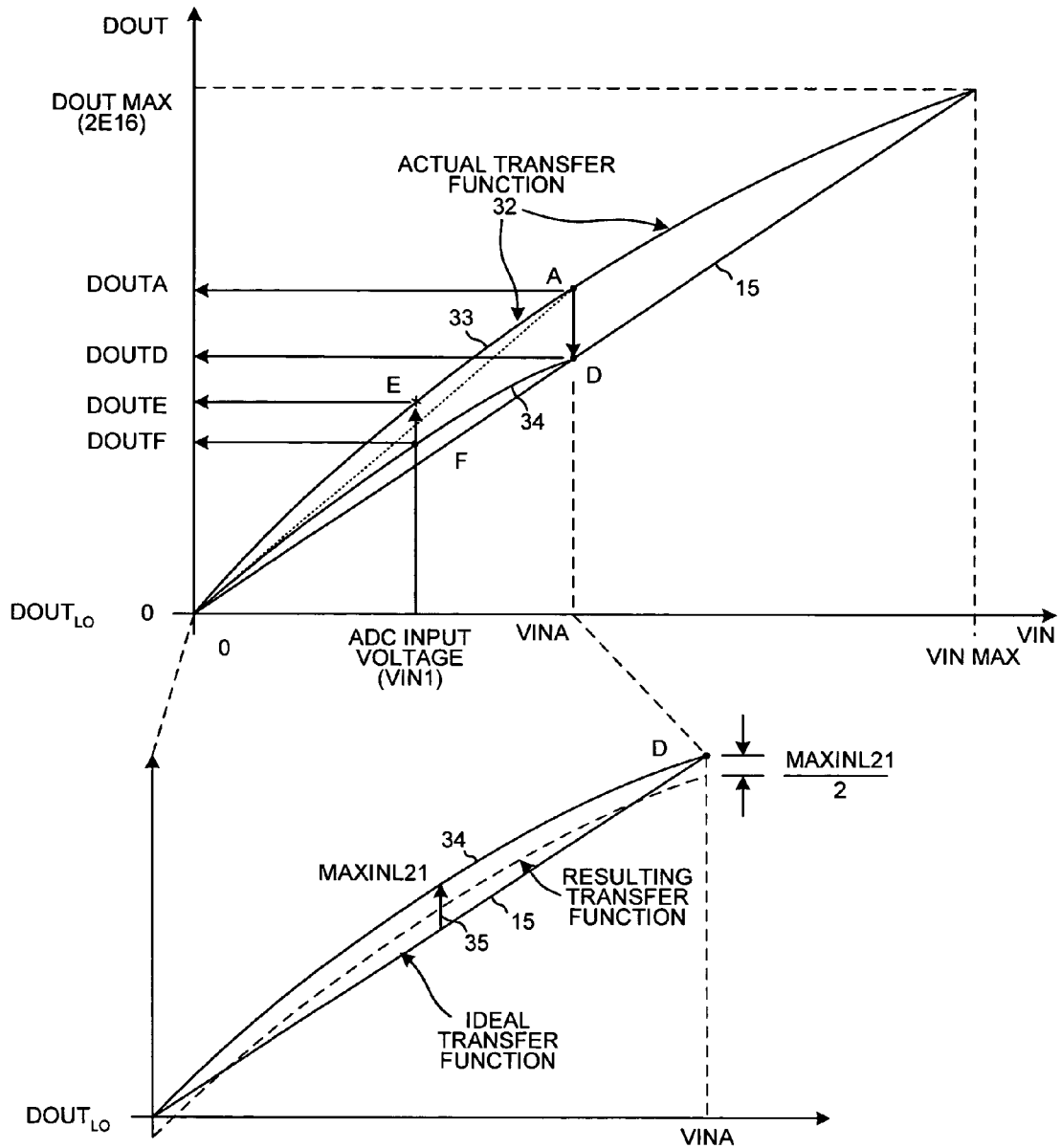
FIGS. 11 and 12 illustrate how to perform scaling and best fit operations if a data output value is determined to be in the first subrange of FIG. 8.

FIG. 11 illustrates the novel method of FIGS. 8-10 in further detail. The range of analog input voltages that can be supplied to ADC 5 is represented in the horizontal dimension. The resulting range of DOUT values that is output by the overall ADC system is illustrated in the vertical dimension. VIN MAX is the maximum analog input voltage that ADC 5 can convert. The ADC system converts VIN MAX into its maximum sixteen-bit digital output value of 2E16 (a DC offset corrected and gain error corrected value). Similarly, VIN is zero volts, the ADC system outputs a sixteen-bit digital zero value (a DC offset corrected and gain error corrected value). Line 32 represents the input-to-output transfer function of the ADC system after DC offset correction and gain error correction. The curve in line 32 indicates remaining non-linearity.

Figures 13, 14:
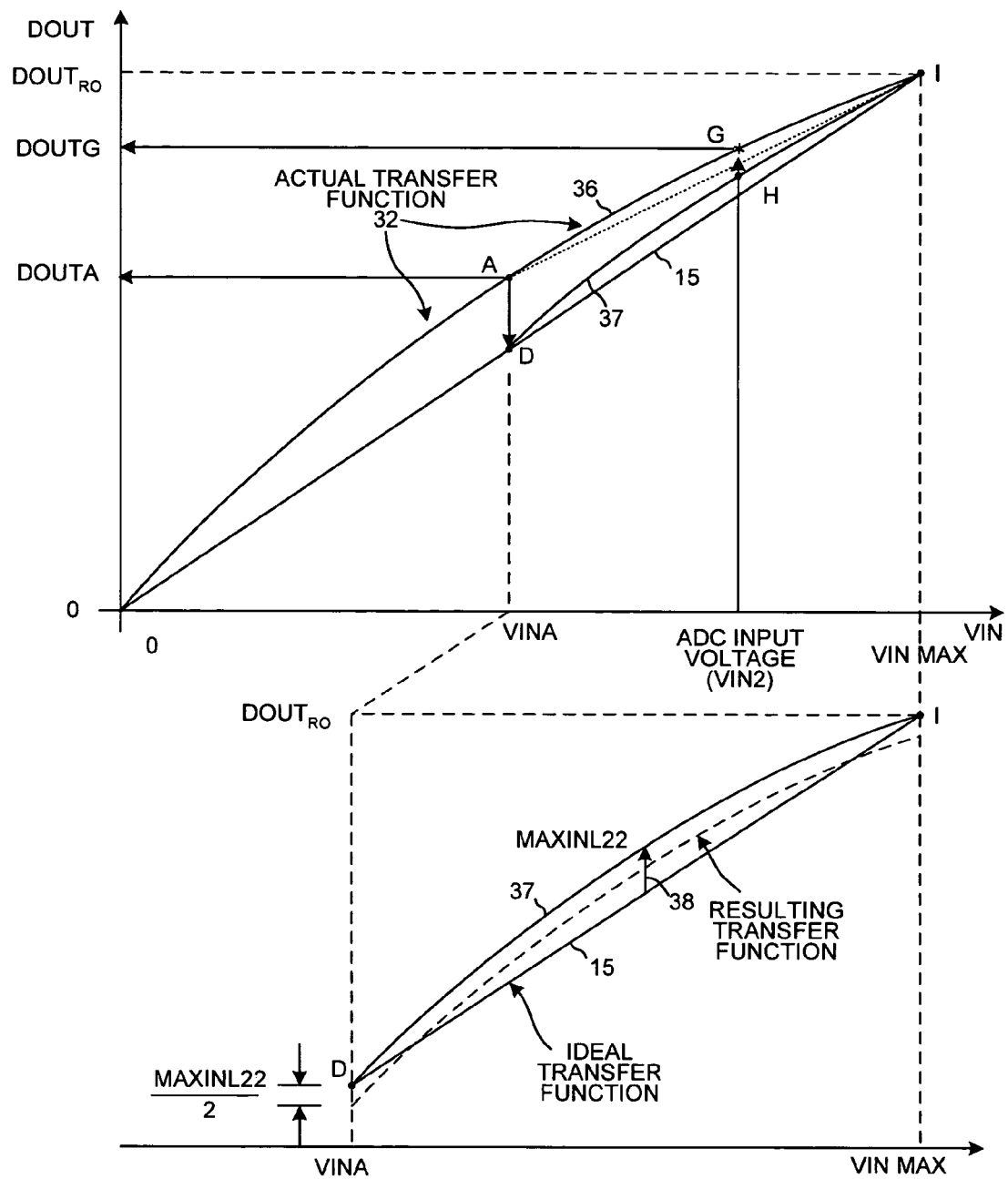
FIGS. 13 and 14 illustrate how to perform scaling and best fit operations if a data output value is determined to be in the second subrange of FIG. 8.

The data output value at point A is denoted DOUTA. The data output value DOUTA is the data output value that has the largest amount of INL error within the range of DOUT values from zero to DOUT MAX (2E16). ADC 5 performs an analog-to-digital conversion and if the resulting DC offset and gain error corrected DOUT value is between zero and DOUTA, then steps illustrated in FIGS. 11 and 12 are performed. If, on the other hand, the resulting DC offset and gain error corrected DOUT value is between DOUTA and DOUT MAX, then steps illustrated in FIGS. 13 and 14 are performed.

FIG. 11 illustrates how a VIN voltage of VIN1 is converted into a data output value of DOUTE disposed on transfer function line 32. Next, INL correction software 7 scales DOUTE by a scaling correctional factor SCF1 such that the result of the scaling is DOUTF. DOUTF in FIG. 11 is the data output value that corresponds to point F. DOUTE is the data output value that corresponds to point E. INL correction software 7 applies the same scaling factor SCF1 regardless of what the DOUT value is as long as DOUT is between zero and DOUTA. The scaling factor is the scaling factor, which if applied to DOUTA (the data output value corresponding to point A), would result in DOUTD (the data output value corresponding to point D on the ideal transfer function line 15). Applying this scaling factor effectively shifts the transfer function curve 33 between the origin and point A to the transfer function curve 34 between the origin and point D. In the present example where VIN1 is the input voltage, applying scaling factor SCF1 to DOUTE generates DOUTF. The lower portion of FIG. 11 illustrates curve 34 in further detail.

Next, INL correction software 7 performs a best fit step that effectively fits curve 34 to ideal transfer function line 15. The maximum INL error of curve 34 is MAXINL21. This maximum is represented in FIG. 11 by arrow 35. INL correction software 7 then adjusts DOUTF by subtracting one half of the maximum INL error MAXINL21. The amount of adjustment is referred to as the "best fit adjustment value" (BFAV1). The same BFAV1 adjustment value is used regardless of what the DOUT value being adjusted is, provided that the DOUT value is on curve 34.

INL correction software 7 can perform the scaling and best fit operations in various ways. In one advantageous aspect, INL correction software 7 calls routines 7A and 7B. Utilizing routines 7A and 7B in both the original DC offset and gain error correction steps and well as in the subsequent INL correction illustrated in FIG. 11 serves to minimize the amount of program memory space required to support the 16-bit INL correction and best fit functionality on the 8-bit processor 8.

FIG. 12 illustrates one example of an equation that can be calculated by INL correction software 7 to perform the scaling and best fit processing so as to output the INL-corrected data output value $DOUT_C$. In the equation, $DOUT_{LO}$ is the "left origin" of the DOUT subrange being considered (zero in this case). Scaling is performed relative to this left origin. DOUT is the DOUT value on curve 33 being processed. MAXINL21 is the maximum INL error value of curve 34.

FIG. 13 illustrates how a DOUT value is processed if the DOUT value is on curve 36 between DOUTA and $DOUT_{RO}$. $DOUT_{RO}$ is the DOUT value at the "right origin" of the DOUT subrange being considered. In the example of FIG. 13, the input voltage being converted by ADC 5 is VIN2. VIN2 is converted into a DC offset and gain corrected data output value of DOUTG disposed on transfer function line 36. INL correction software 7 employs a scaling correction factor SCF2 to DOUTG to generate DOUTH. The scaling factor SCF2 is the scaling factor, which if applied to DOUTA (the data output value corresponding to point A), would result in DOUTD (the data output value corresponding to point D on the ideal transfer function line 15). Scaling is performed relative to the right origin. Applying the scaling factor SCF2 effectively shifts the transfer function curve 36 between the point A and point I to the transfer function curve 37 between point D and point I. In the present example where VIN2 is the input voltage, applying scaling factor SCF2 to DOUTG generates DOUTH. The lower portion of FIG. 13 illustrates curve 37 in further detail.

Next, INL correction software 7 performs a best fit operation that effectively fits curve 37 to ideal transfer function line 15. The maximum INL error of curve 37 is MAXINL22. This maximum is represented in FIG. 13 by arrow 38. INL correction software 7 adjusts DOUTH by subtracting one half of the maximum INL error MAXINL22. The amount of adjustment is referred to as the "best fit adjustment value" (BFAV2). The same BFAV2 adjustment value is used regardless of what the DOUT value being adjusted is, provided that the DOUT value is on curve 37.

FIG. 14 illustrates one example of an equation that can be calculated by INL correction software 7 to perform the scaling and best fit processing of FIGS. 13 and 14. The term "scaling" here means converting a value that would be disposed on one of curves 33 or 36 into a corresponding point directly below on one of curves 34 and 37. Scaling DOUTA by SCF1 results in converting DOUTA into the corresponding point DOUTD directly below on curve 34. Similarly, scaling DOUTA by SCF2 results in converting DOUTA into the corresponding point DOUTD directly below on curve 37.

Figure 15:
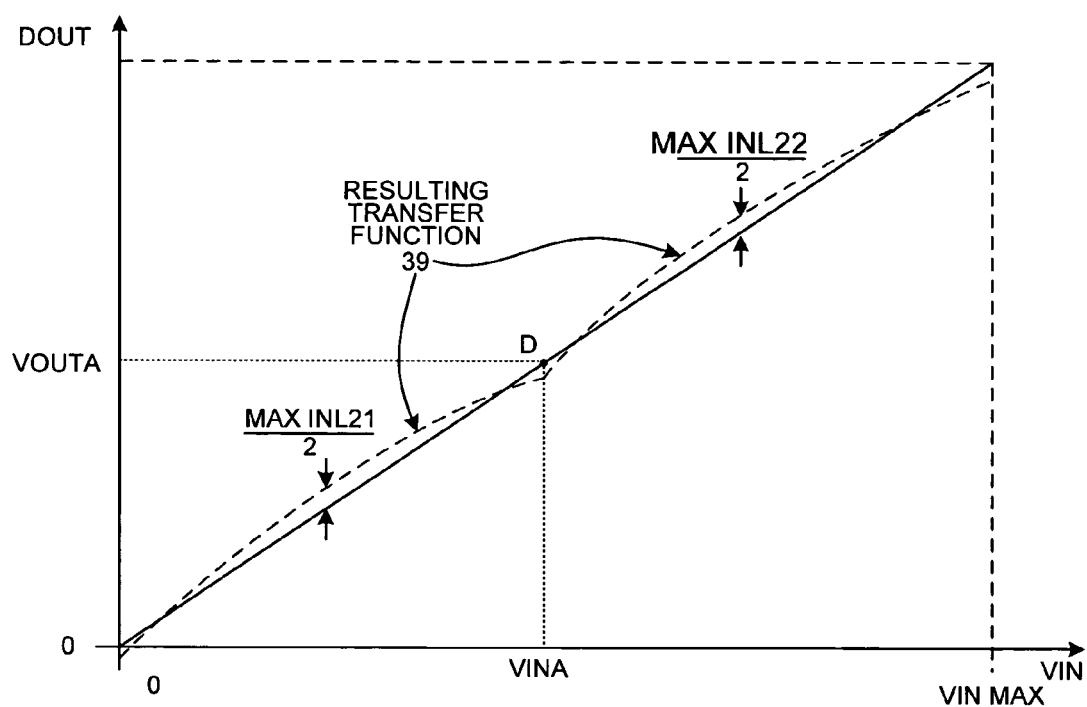
FIG. 15 illustrates a transfer function that results from performing the method of FIGS. 8-14.

FIG. 15 is a graph that illustrates the resulting INL corrected transfer function 39. As an example, the MAX INL represented by arrow 27 in FIG. 8 is two LSB, ADC 5 outputs 16-bit values, and the $DOUT_C$ resulting transfer function of FIG. 15 exhibits less than plus or minus 0.5 LSB INL error.

Figure 16:
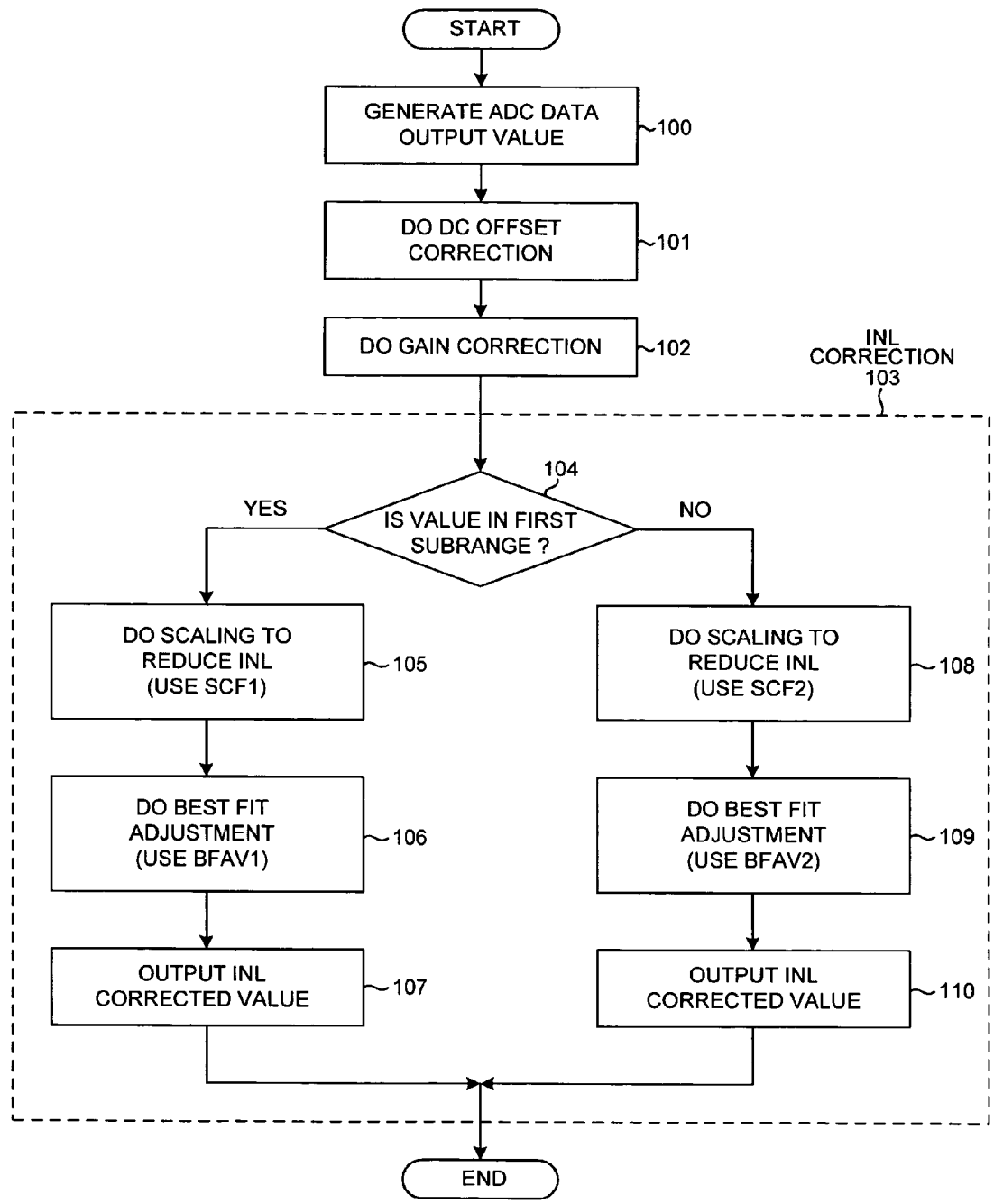
FIG. 16 is flowchart of the method of FIGS. 8-14.

FIG. 16 is a simplified flowchart of the method set forth above. ADC 5 receives an analog input voltage VIN and generates (step 100) a digital data output value DOUT. DC offset correction 101 and gain correction 102 are performed such that the DOUT value presented to INL correction portion 103 is DC offset corrected and gain error corrected.

INL correction and best fit software 7 then determines in which one of two DOUT subranges the incoming DOUT value resides. In one example, the value DOUTA is stored in memory 14 as two-byte value 9. If the incoming DOUT value is less than DOUTA, then DOUT resides in a first DOUT subrange (see for example the subrange between DOUTLO and DOUTA depicted in FIG. 11). If, on the other hand, DOUT is greater than DOUTA, then DOUT resides in a second DOUT subrange (see for example the subrange between DOUTA and DOUTRO in FIG. 13). Whether the incoming DOUT is in the first subrange or the second subrange is determined in step 104. If the incoming DOUT is determined to be in the first subrange, then steps 105-107 are performed. If the incoming DOUT is determined to be in the second subrange, then steps 108-110 are performed.

In step 105, scaling correction factor SCF1 is used to scale DOUT as indicated in FIG. 11. In step 106, best fit adjustment value (BFAV1) is used to adjust the result of step 105 to make a "best fit" to ideal transfer function line 15. The scaling and best fit operations of steps 105 and 106 can be performed together (for example, by employing the equation of FIG. 12). The result is output 107 by INL correction software 7 as the final corrected ADC output value.

If the incoming DOUT is determined (step 104) to be in the second DOUT subrange, then INL correction software 7 uses scaling correction factor SCF2 to scale DOUT (step 108) as indicated in FIG. 13. In step 109, best fit adjustment value (BFAV2) is used to adjust the result of step 108 to make a "best fit" to ideal transfer function line 15. The scaling and best fit operations of steps 108 and 109 can be performed together (for example, by employing the equation of FIG. 14). The result is output 110 by INL correction software 7 as the final corrected ADC output value. Microcontroller integrated circuit 2 does not involve a large amount of memory dedicated to storing an INL correction lookup table. Rather, in this example, microcontroller stores only five values (DOUTA, SCF1, BFAV1, SCF2, BFAV2) and the INL correction program 7.

Figure 17:
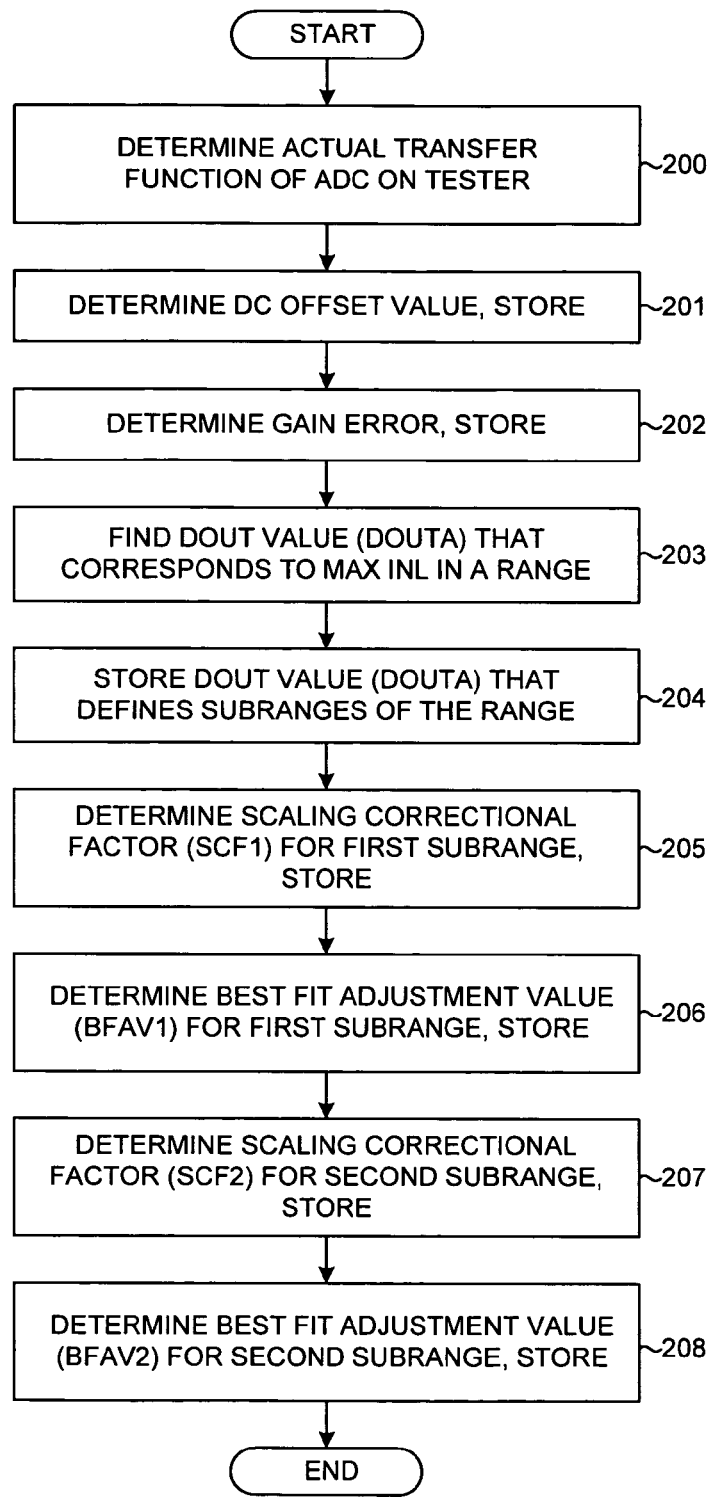
FIG. 17 is a flowchart of one way of determining INL correction values used in the method of FIGS. 8-14.

FIG. 17 is a simplified flowchart of a method usable to determine and load the values 9-13 into microcontroller 2. In this example, each microcontroller integrated circuit is tested (step 200) separately to determine its actual transfer function. From the actual transfer function, the DC offset value is determined (step 201) and the gain error is determined (202). These two values can be stored on microcontroller 2 in memory 14 so that they can later be used to perform DC offset and gain error correction (see steps 100-102 of FIG. 16). Next, an analysis program executing on a computer analyzes the measured and corrected actual transfer function data and determines (step 203) a DOUTA value to separate subranges of DOUT values. In one example, this DOUTA value is the DOUT value that corresponds to the maximum INL error value in a range of DOUT values. The DOUTA value is stored (step 204) in memory 14.

Next, the computer determines the scaling correctional factor SCF1 for the first subrange (step 205) and a best fit adjustment value (BFAV1) (step 206) for the first subrange. These values are stored into memory 14.

Similarly, the computer determines the scaling correctional factor SCF2 for the second subrange (step 207) and a best fit adjustment value (BFAV1) (step 208) for the first subrange. These values are stored into memory 14. The values determined can be determined in other orders and can be stored in different orders or all at once. Once stored, the INL correction software 7 of microcontroller 2 is able to use the stored values 9-13 to perform the novel scaling and best fit method without need to resort to a large and expensive INL correction lookup table. The amount of semiconductor die area consumed to provide the INL correction function is reduced in comparison to INL correction techniques employing large lookup tables.

Figure 18:
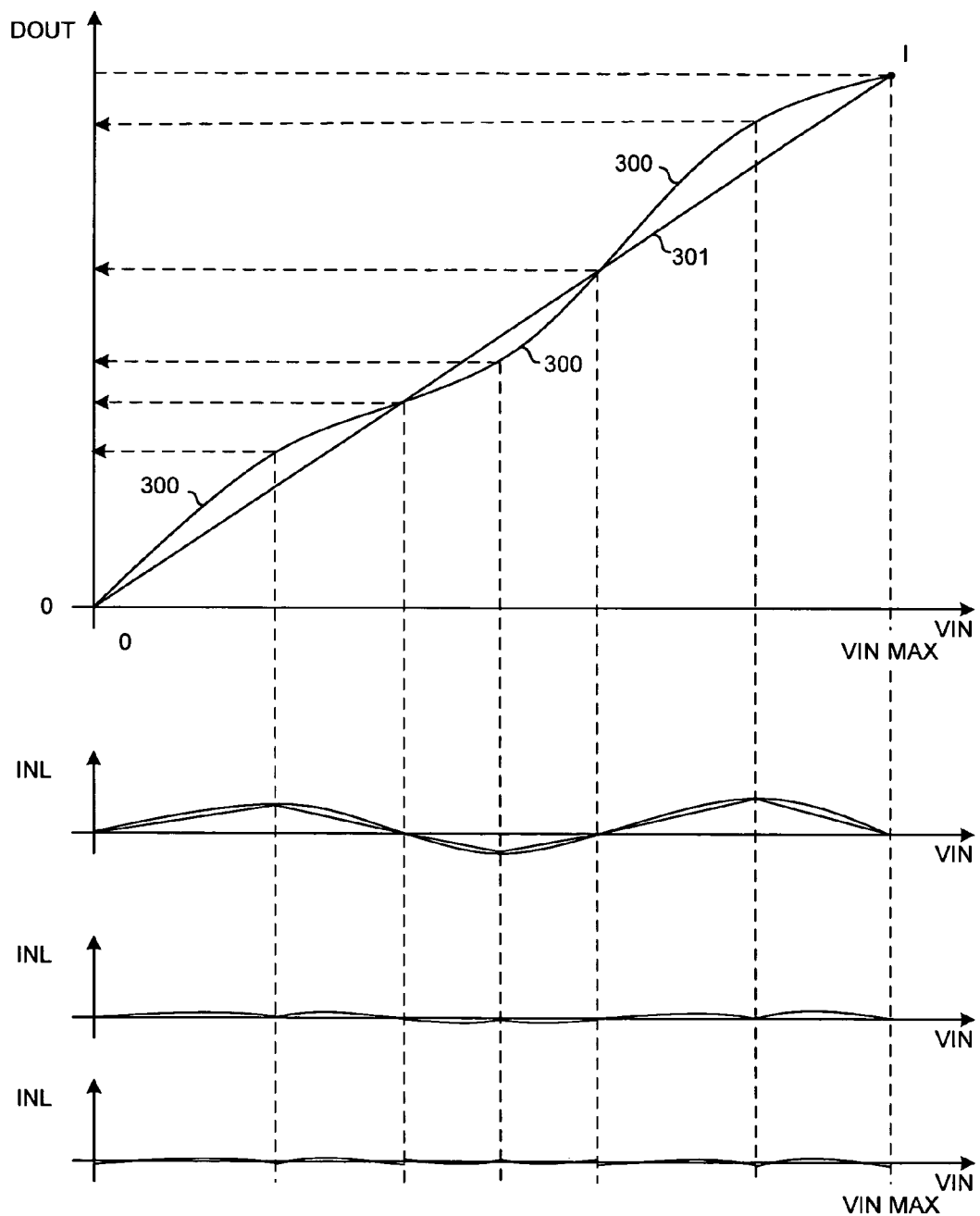
FIGS. 18 and 19 illustrate an extension of the method of FIGS. 8-14 to three ranges, each range involving two subranges.

FIG. 18 is a diagram of an extension of the above described method. The actual transfer function line 300 has three curved sections. The method set forth above of breaking a range of DOUT values up into two subranges and performing the scaling and best fit operations on each of those subranges is performed on each of the three curve DOUT sections (ranges). The second graph down in FIG. 18 illustrates the six scaling correctional factors (there are two such factors for each DOUT range). The third graph down in FIG. 18 illustrates the INL error remaining after the scaling. The lowest graph in FIG. 18 illustrates the best fit adjustment of each of the six subranges.

Figure 19:
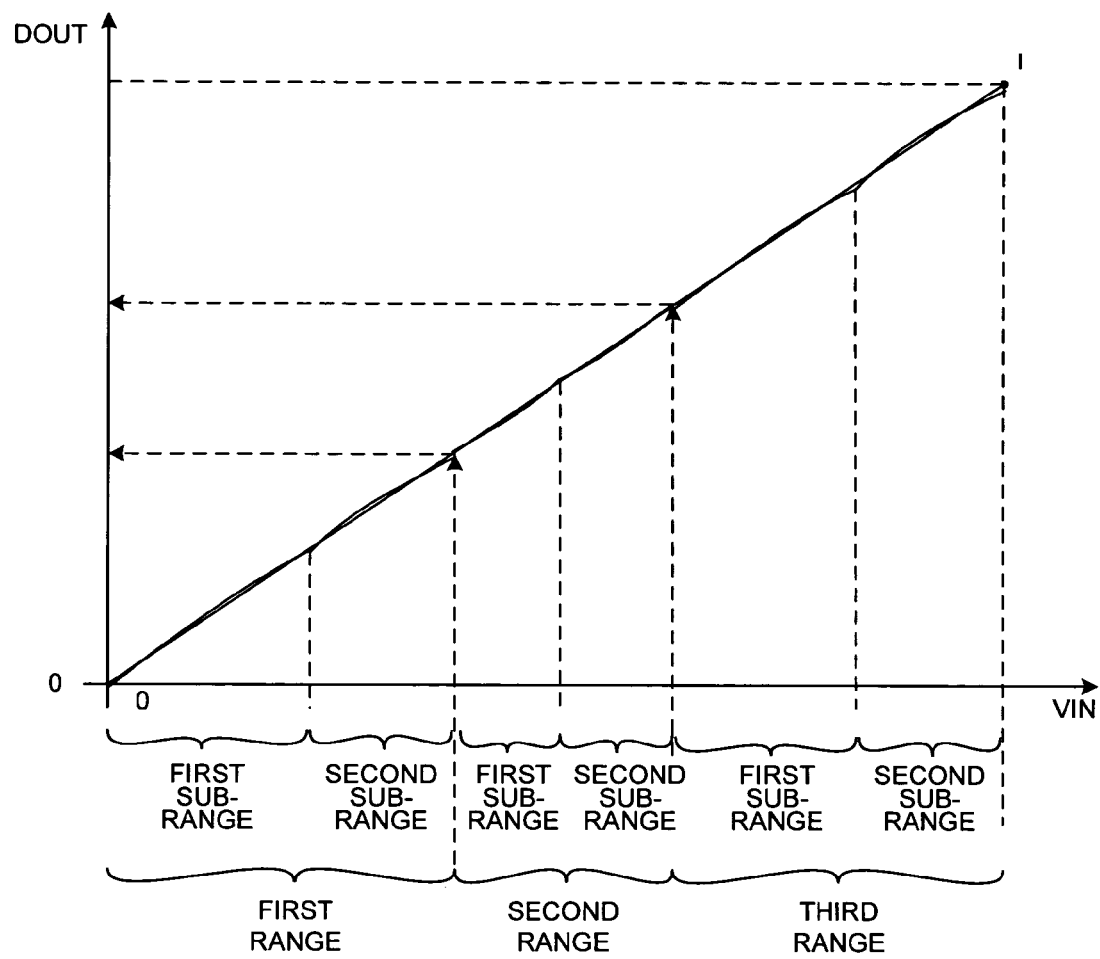

FIG. 19 illustrates the resulting transfer function after performing the scaling and best fit operations of FIG. 18. In similar fashion, the scaling and best fit method set forth above can be extended to employ more than three ranges in the processing of the output of an ADC. At times when INL corrected DOUT values are not needed for processing, INL correction program 7 is not executed. By not executing program 7, memory accesses and ALU operations and other processing that would have occurred had program 7 been executed are not performed. Microcontroller power consumption is therefore reduced.

Although the present invention has been described in connection with certain specific embodiments for instructional purposes, the present invention is not limited thereto. Although an example is set forth where the actual scaling correctional factors are stored on the microcontroller in memory, the scaling correctional factors need not be stored but rather values involved in calculating the scaling correctional factors can be stored and the scaling correctional factors can be calculated by software 7. Similarly, the best fit adjusting values need not be stored on the microcontroller in memory, but rather values involved in calculating the best fit adjusting values can be stored and the best fit adjusting values can be calculated by software 7. Although particular equations are set forth in FIGS. 12 and 14 for determining the final INL-corrected data output values, these equations are merely illustrative. Many different equations can be derived that accomplish the same function. Software 7 can therefore be made to employ any suitable algorithm that accomplishes the scaling and best fit operations illustrated in the diagrams. Accordingly, various modifications, adaptations, and combinations of various features of the described embodiments can be practiced without departing from the scope of the invention as set forth in the claims.

What is claimed is:

1. A method comprising:
  (a) storing in an integrated circuit a data output value A (DOUTA) corresponding to a maximum integral non-linearity value (MAXINL), wherein for a data output value range of an analog-to-digital converter there is a corresponding integral non-linearity (INL) value function, wherein MAXINL is a maximum INL value of the INL value function over the data output value range, wherein the data output value range is divisible into a first subrange and a second subrange, wherein the second subrange adjoins the first subrange but does not overlap the first subrange, wherein DOUTA is a data output value of the analog-to-digital converter at one end of the first subrange, wherein the analog-to-digital converter is a part of the integrated circuit;
  (b) storing in the integrated circuit a best fit adjustment value (BFAV1);
  (c) analog-to-digital converting an input voltage VIN1 into a data output value E (DOUTE), wherein DOUTE is in the first subrange;
  (e) scaling DOUTE by a scaling correctional factor SCF1 to obtain a value DOUTF; and
  (f) adjusting DOUTF using BFAV1 to obtain a best fit INL-corrected data output value.

2. The method of claim 1, further comprising:
  (g) repeating the analog-to-digital converting of step (c) and the scaling of step (e) and the adjusting of step (f) for additional input voltages to obtain additional data output values in the first subrange, wherein each repeat uses the same scaling correctional factor SCF1 in step (e) and uses the same BFAV1 in step (f).

3. The method of claim 2, wherein step (c) involves supplying VIN1 to the analog-to-digital converter, performing an analog-to-digital conversion, then performing DC offset error correction and gain error correction to obtain DOUTE.

4. The method of claim 2, wherein DOUTA and DOUTE are DC offset error corrected and gain error corrected versions of data output values output from the analog-to-digital converter.

5. A method comprising:
  (a) storing in an integrated circuit a data output value A (DOUTA) corresponding to a maximum integral non-linearity value (MAXINL), wherein for a data output value range of an analog-to-digital converter there is a corresponding integral non-linearity (INL) value function, wherein MAXINL is a maximum INL value of the INL value function over the data output value range, wherein the data output value range is divisible into a first subrange and a second subrange, wherein the second subrange adjoins the first subrange but does not overlap the first subrange, wherein DOUTA is a data output value of the analog-to-digital converter at one end of the first subrange, wherein the analog-to-digital converter is a part of the integrated circuit;
  (b) storing a first scaling correctional factor SCF1 in the integrated circuit, wherein SCF1 is a scaling correctional factor for the first subrange;
  (c) storing a second scaling correctional factor SCF2 in the integrated circuit, wherein SCF2 is a scaling correctional factor for the second subrange;
  (d) analog-to-digital converting a first input voltage VIN1 into a first data output value E (DOUTE), wherein DOUTE is a DC offset corrected and gain error corrected version of a data output of the analog-to-digital converter, wherein DOUTE is in the first subrange;
  (e) scaling DOUTE by SCF1 to obtain a first INL-corrected data output value;
  (f) analog-to-digital converting a second input voltage VIN2 into a second data output value G (DOUTG), wherein DOUTG is a DC offset corrected and gain error corrected version of a data output of the analog-to-digital converter, wherein DOUTG is in the second subrange; and
  (g) scaling DOUTG by SCF2 to obtain a second INL-corrected data output value.

6. The method of claim 5, wherein scaling DOUTA by SCF1 would result in a first ideally linear INL-corrected data output value (DOUTD), wherein scaling DOUTA by SCF2 would result in a second ideally linear INL-corrected data output value, and wherein the first and second ideally linear INL-corrected data output values are substantially identical.

7. The method of claim 5, further comprising:
(h) adjusting the first INL-corrected data output value by a first best fit adjustment value (BFAV1); and
(i) adjusting the second INL-corrected data output value by a second best fit adjustment value (BFAV2).

8. The method of claim 7, further comprising:
(j) repeating the analog-to-digital converting of step (d) to analog-to-digital convert another input voltage into another DC offset and gain error corrected data output value in the first subrange, and repeating the scaling of step (e) on the other DC offset and gain error corrected data output value using SCF1 to obtain another INL-corrected data output value, and repeating the adjusting of step (h) on the other INL-corrected data output value using BFAV1.

9. A method, comprising:
(a) using an analog-to-digital converter to generate a plurality of analog-to-digital converter (ADC) data output values, wherein some of the ADC data output values are in a first subrange, and wherein others of the ADC data output values are in a second subrange;
(b) applying a first scaling correctional factor SCF1 to the ADC data output values in the first subrange, wherein said applying of (b) converts each ADC data output value in the first subrange into a corresponding INL-corrected value;
(c) adjusting the corresponding INL-corrected values generated in (b) by a first best fit adjustment value (BFAV1);
(d) applying a second scaling correctional factor SCF2 on the ADC data output values in the second subrange, wherein said applying of (d) converts each ADC data output value in the second subrange into a corresponding INL-corrected value; and
(e) adjusting the corresponding INL-corrected values generated in (d) by a second best fit adjustment value (BFAV2).

10. The method of claim 9, wherein the plurality of ADC data output values of (a) are DC offset corrected and gain error corrected versions of values output by the analog-to-digital converter.

11. The method of claim 9, wherein the first subrange of ADC data output values adjoins the second subrange of ADC data output values at an analog-to-digital output value DOUTA, wherein applying SCF1 to DOUTA results in the same data output value DOUTD as applying SCF2 to DOUTA.

12. The method of claim 11, wherein the ADC is part of an integrated circuit, and wherein DOUTA is stored on the integrated circuit.

13. The method of claim 11, wherein the ADC is part of an integrated circuit, and wherein DOUTA is stored on the integrated circuit, and wherein SCF1, SCF2, BFAV1 and BFAV2 are also stored on the integrated circuit.

14. An integrated circuit, comprising:
an analog-to-digital converter (ADC);
a memory that stores a value DOUTA; and
a digital processor that executes an integral non-linear (INL) correction program, wherein execution of the program scales a value output from the ADC by a first scaling correctional factor SCF1 if the value is less than DOUTA and is in a first subrange of ADC output values, wherein the program scales the value output from the ADC by a second scaling correctional factor SCF2 if the value is greater than DOUTA and is in a second subrange of ADC output values, and wherein scaling DOUTA by SDF1 would generate the same scaled value that scaling DOUTA by SDF2 would generate.

15. The integrated circuit of claim 14, wherein the first subrange and the second subrange adjoin and together constitute a contiguous range of ADC output values, wherein the value DOUTA corresponds to a maximum integral non-linearity value of the range.

16. The integrated circuit of claim 14, wherein the scaling correctional factors SDF1 and SDF2 are stored in the memory.

17. The integrated circuit of claim 14, wherein the memory stores information adequate to determine SDF1 and SDF2 but does not store SDF1 or SDF2, and wherein the program calculates SDF1 and SDF2 using the stored information.

18. The integrated circuit of claim 14, wherein there is an ideally linear transfer function for the analog-to-digital converter, and wherein scaling DOUTA by SCF1 would result in a scaled value that satisfies the ideally linear transfer function.

19. An integrated circuit, comprising:
an analog-to-digital converter (ADC);
a memory that stores a value DOUTA; and
means for scaling a value DOUT output from the ADC by a first scaling correctional factor SCF1 if the value DOUT is less than DOUTA and is in a first subrange of ADC output values, and wherein the means is also for scaling the value DOUT by a second scaling correctional factor SCF2 if the value DOUT is greater than DOUTA and is in a second subrange of ADC output values, and wherein the scaling performed by the means is such that if DOUTA were scaled by SDF1 then substantially the same value would be generated as would be generated were DOUTA scaled by SDF2.

20. The integrated circuit of claim 19, wherein the value DOUT is a DC offset corrected and gain error corrected version of an output of an the ADC.

* * * * *